United States Patent [19]

Nakazato et al.

[11] Patent Number: 5,314,068
[45] Date of Patent: May 24, 1994

[54] CONTAINER FOR A PLATE-LIKE ARTICLE

[75] Inventors: Hiroshi Nakazato; Gen Nakamura; Satoshi Yoshinari, all of Yokohama, Japan

[73] Assignee: Canon Kabushiki Kaisha, Tokyo, Japan

[21] Appl. No.: 911,055

[22] Filed: Jul. 9, 1992

[30] Foreign Application Priority Data

Jul. 12, 1991 [JP] Japan .................................. 3-197354
May 28, 1992 [JP] Japan .................................. 4-160049

[51] Int. Cl.⁵ .............................................. B65D 85/38
[52] U.S. Cl. ...................................... 206/454; 206/334
[58] Field of Search ................................. 206/328–334, 206/449, 451, 454, 455, 459.5, 459.1, 521, 565; 220/326

[56] References Cited

U.S. PATENT DOCUMENTS

| | | | |
|---|---|---|---|
| 3,256,975 | 6/1966 | Puente | 206/328 |
| 3,552,548 | 1/1971 | Wallestad et al. | 206/328 |
| 3,615,006 | 10/1971 | Freed | 206/62 R |
| 4,105,121 | 8/1978 | Mascetti | 206/459.5 |
| 4,197,947 | 4/1980 | Zaidi | 206/459.1 |
| 4,422,547 | 12/1983 | Abe et al. | 206/334 |
| 4,552,268 | 11/1985 | Lee | 206/459.1 |
| 4,776,462 | 10/1988 | Kosugi et al. | 206/334 |
| 4,830,182 | 5/1989 | Nakazato et al. | 206/334 |
| 4,842,136 | 6/1989 | Nakazato et al. | 206/328 |
| 5,012,926 | 5/1991 | Jamison | 206/334 |
| 5,168,993 | 12/1992 | Yen | 206/455 |

FOREIGN PATENT DOCUMENTS 2031322 1/1971 Fed. Rep. of Germany.
1305726 2/1973 United Kingdom.

*Primary Examiner*—Jimmy G. Foster
*Attorney, Agent, or Firm*—Fitzpatrick, Cella, Harper & Scinto

[57] ABSTRACT

A container for containing therein a plate-like article, such as a reticle, includes a bottom member having a holding portion for holding the article in a substantially laid-down state; an upper member to be mated with the bottom member to define a space above the upper surface of the article; a pressing member for resiliently pressing in the space the article against the holding portion; and a fixing portion having an engaging member being supported by the upper member and being engageable with an end portion of the bottom member. The engaging member is effective to prevent upward opening motion of the upper member due to a reaction force of the pressing member. In addition, a releasing portion is partially projectable into the fixing portion to press the same in the same direction as the direction of the opening motion of the upper member to thereby release the engaging member.

14 Claims, 12 Drawing Sheets

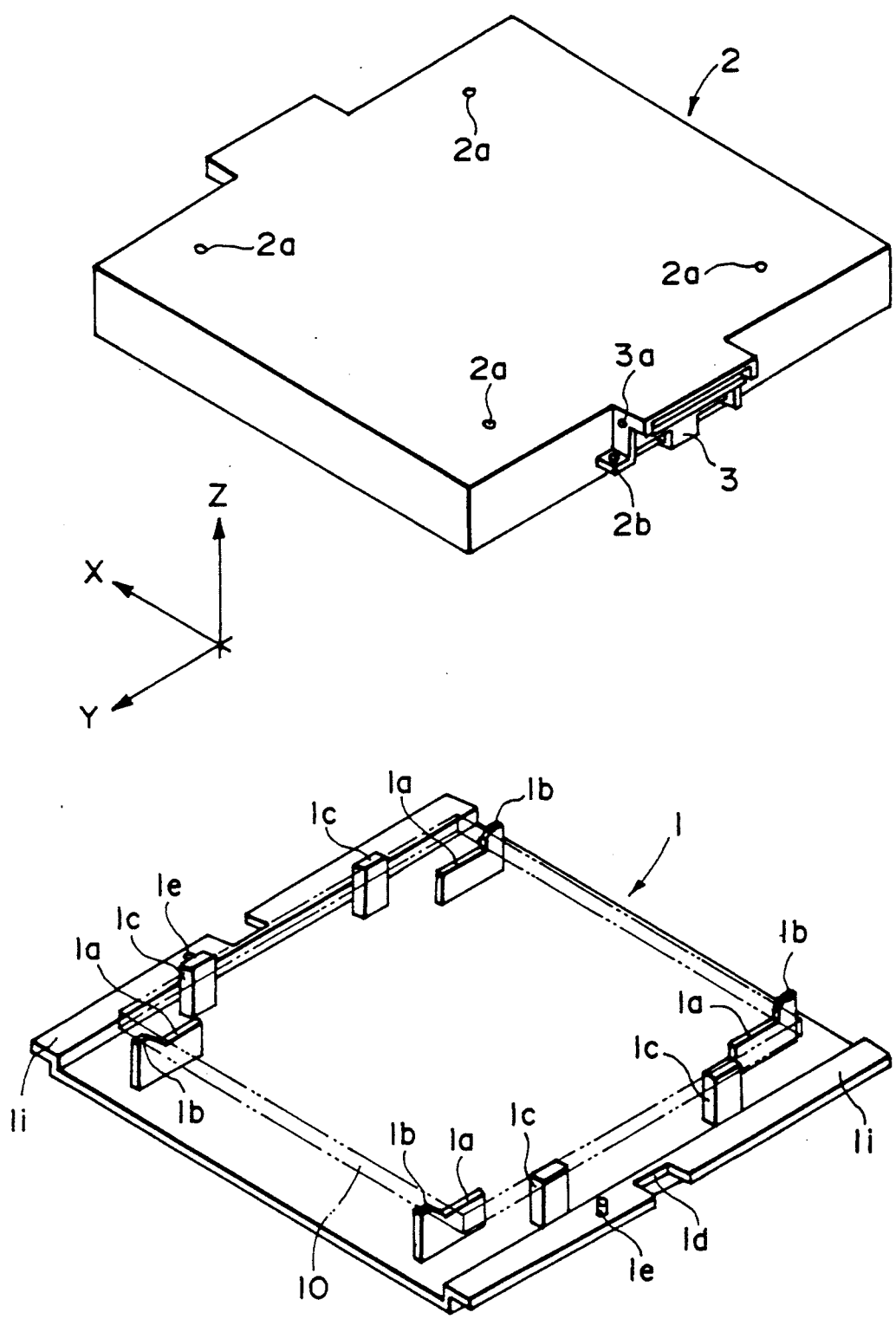
F I G. 1

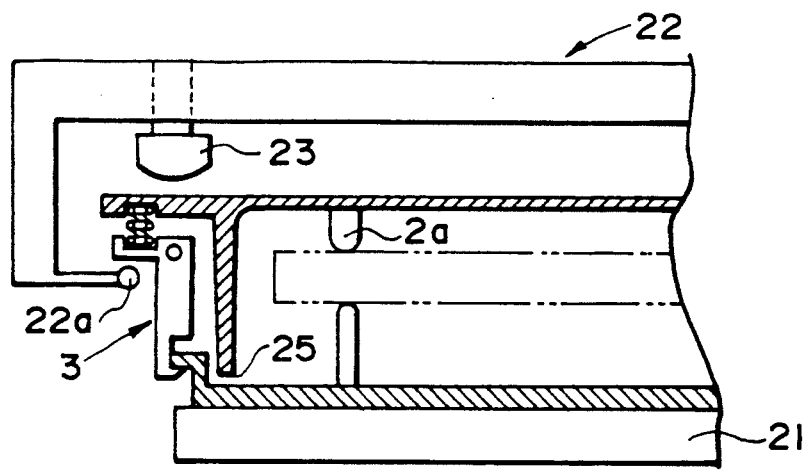
F I G. 4A
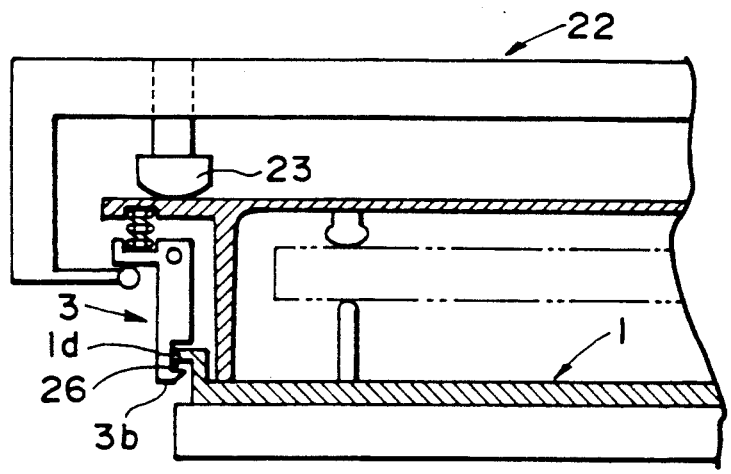
F I G. 4B
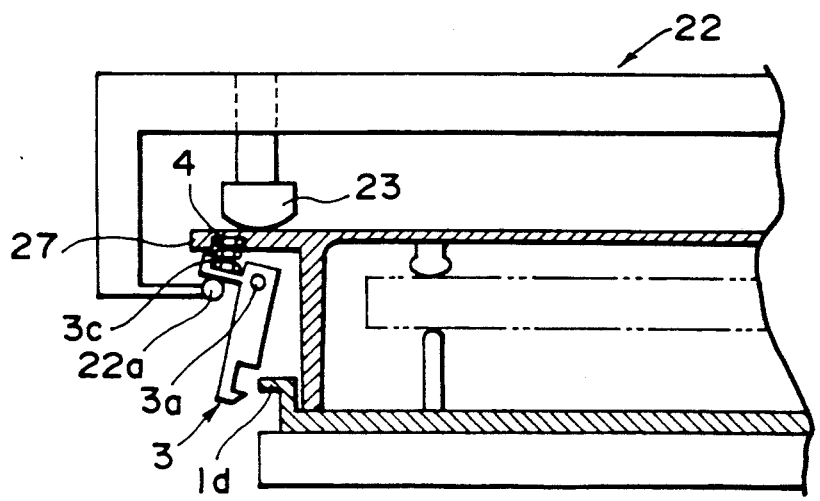
F I G. 4C

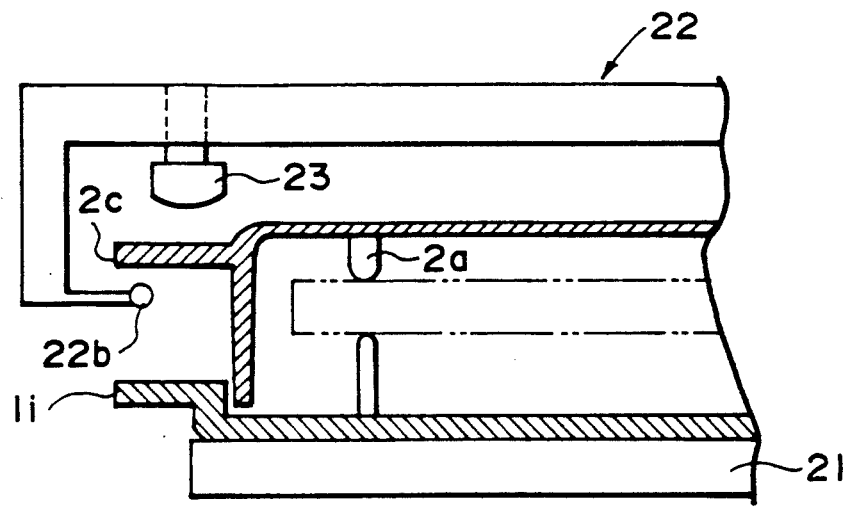
F I G. 11A
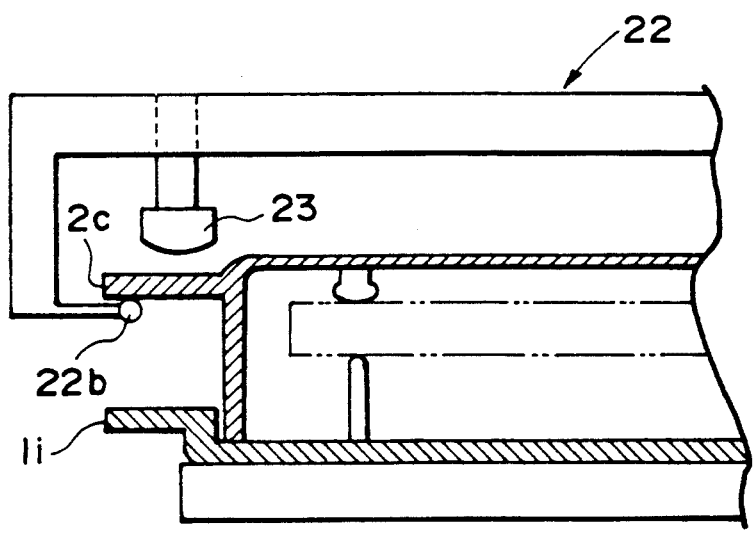
F I G. 11B

CONTAINER FOR A PLATE-LIKE ARTICLE

FIELD OF THE INVENTION AND RELATED ART

This invention relates to a dust-proof container for a substrate or a plate-like article such as a reticle, a photomask or a wafer, to be used in the manufacture of semiconductor devices such as LSIs, and also to an opening mechanism for such a container.

In this type of container generally, when a substrate is to be stored, an operating member for suppressing the substrate is provided which rotates in response to the opening/closing motion of a door member (upper cover member), and a pressing force is produced by an urging means such as a spring. For an opening mechanism for opening/closing the container, an opening lever engaging with the door member is provided by which the container can be opened. Also, the urging force for the opening is transmitted through a complicated mechanism. Further, it is necessary to use a complicated mechanism or members for stably holding the container. Moreover, the container having a substrate stored therein, itself is stored in a substantially horizontally laid-down attitude.

In these types of containers or opening mechanisms, there is a disadvantage of production of dust or foreign particles from a rotary bearing means or a linkage mechanism, causing adverse effects on semiconductor devices to be manufactured by using a substrate stored therein. Also, there is a problem that the attitude of the container having a substrate therein, when it is to be stored, is limited and thus the efficiency of container storing is not good.

SUMMARY OF THE INVENTION

It is accordingly an object of the present invention to provide a substrate container or a lid opening device by which the production of dust can be reduced and by which the yield of products such as semiconductor devices can be improved.

It is another object of the present invention to provide a substrate container which can be held either in a substantially upstanding position or in a substantially laid-down position.

In accordance with an aspect of the present invention, to achieve these objects, there is provided a container for containing therein a plate-like article such as a reticle, comprising: a bottom member having a holding portion for holding the article in a substantially laid-down state; an upper member to be mated with the bottom member to define a space above the upper surface of the article; a pressing member for resiliently pressing in the space the article against the holding portion; fixing means having an engaging member being supported by the upper member and being engageable with an end portion of the bottom member, the engaging member being effective to prevent upward opening motion of the upper member due to a reaction force of the pressing member; and releasing means partially projectable into the fixing means to press the fixing means in the same direction as the direction of the opening motion the upper member to thereby release the engaging member.

In accordance with another aspect of the present invention, there is provided an opening mechanism to be used with a conveying device for conveying a plate-like article, taken out of such a container, wherein the opening mechanism includes first holding means for holding the bottom member; second holding means for holding the upper member; and opening/closing means operable, when the upper member is to be opened or closed, to release or engage the engaging member after a space is defined between the bottom member and the engaging member.

In one preferred form of the present invention, the container includes a projecting plate which extends and projects partially into the upper member of the container and which serves to stably hold the upper member when the same is opened/closed in the opening/closing device. The outer peripheral size of the upper member is made substantially equal to that of the bottom member, including the projecting plate.

The container of the present invention may include a pressing member for resiliently pressing an article in the container. This avoids the necessity of using a mechanism which requires rotation or sliding motion in the container. Thus, there is no source of dust production in the container. Also, the direction of unlocking of the upper and bottom members of the container may be made in the same direction as the lifting motion of the upper member. This allows use of a minimum actuator for the opening/closing motion of the upper member. Also, the mechanism involved with the unlocking operation or with the upper member opening/closing mechanism does not require use of a complicated linkage mechanism. Thus, the opening device of the present invention assures not only simplification of structure but also reduction of dust production outside the container. And, as a result of reduction of dust production inside and outside the container, the yield of products such as semiconductor devices can be improved significantly.

The upper member of the container may be provided with a projecting member and the upper member holding means of the opening device may be so structured that the upper member may be supported through the projecting member. This ensures further simplification in structure of the upper member holding means and, thus, further reduction of dust production from the holding means. Consequently, the production of dust outside the container can be reduced further.

The outside peripheral size of the upper member of the container may be made substantially equal to that of the bottom member. This allows storing of the container in its upstanding position or laid-down position. Thus, the efficiency of storing can be enhanced. Where in that occasion the free end of the projecting member is aligned with the outside periphery of the bottom member, the stability in upstanding storing can be improved significantly.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a perspective view of a cassette according to an embodiment of the present invention, wherein its upper cover member and bottom tray member are separated.

FIGS. 4A–4C are fragmentary and schematic views for explaining the operation of the cassette opening mechanism of FIG. 3.

FIGS. 11A and 11B are similar to FIGS. 10A and 10B, but taken on line B—B.

DESCRIPTION OF THE PREFERRED EMBODIMENTS

Figure 2:
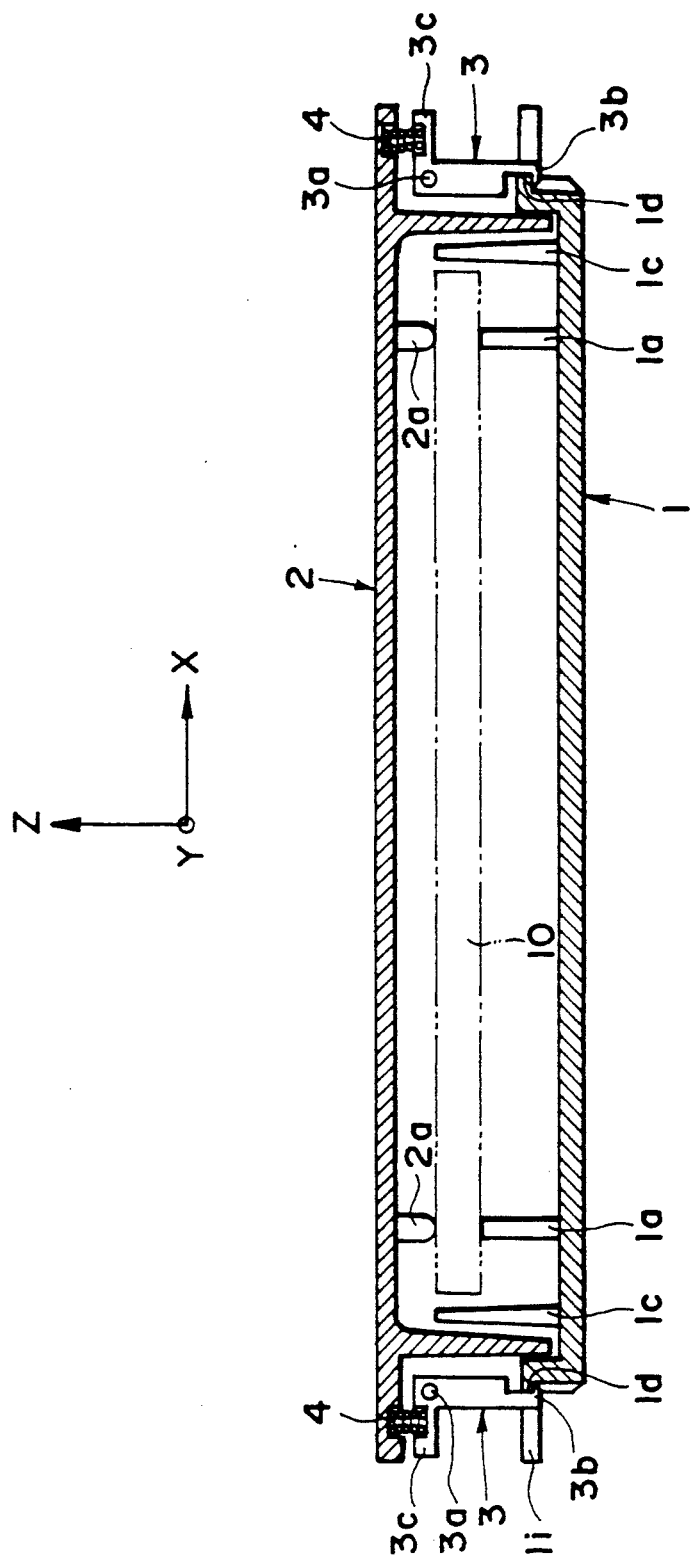
FIG. 2 is a sectional view of the cassette of FIG. 1, taken on line A—A, wherein a substrate is stored in the cassette.

FIG. 1 is a perspective view of a container which can be called a "cassette", for storing therein a substrate such as a reticle. The cassette includes an upper cover member 2 and a bottom tray member 1 which are separated from each other in the illustrated state. The bottom tray member 1 is provided with four holding members 1a, for holding the bottom surface of the substrate at its four corners, as well as four limiting members 1b and additional four limiting members 1c all being effective to limit the lateral motion (in X or Y direction) of the substrate. Each limiting member 1b is formed at an end on the upper surface of one of the corresponding holding members 1a. On the opposite sides of the bottom tray member 1 with respect to the X direction, there are provided collars 1i with which the cassette can be held within a cassette library of a main apparatus. Between the approximately outside periphery of the substrate 1 to be held by the holding members 1a and the outside periphery of the bottom tray member 1, each collar 1i is provided with a notch 1d for defining an engaging portion to be engaged with an upper cover member engaging member 3, as well as a projecting pin 1e for limiting the position of the upper cover member 2 in the horizontal direction (X and Y directions).

On the other hand, the upper cover member 2 is provided with four pressing members 2a (only the mounting positions of them are illustrated) for pressing a substrate 10, within a predetermined space defined between the upper cover member 2 and the substrate 10 as placed on the bottom tray member 1. Each pressing member 2a opposes one of the corresponding holding members 1a as the upper cover member 2 and the bottom tray member 1 are mated with each other. At the opposite sides with respect to the X direction, the upper cover member 2 is further provided with holes 2b to be engaged with the projecting pins 1e, respectively, as well as engaging members 3 each being rotatably supported by a corresponding hinge 3a.

FIG. 2 is a sectional view of the cassette and shows the bottom tray member 1 and the upper cover member 2 engaged with each other through the engaging members 3. In the illustrated position, the engaging member 3 is pressed against the engagement notch 1d by the urging force of the spring, with the hinge 3a being taken as a rotational center. Thus, it serves as a limiting member for maintaining a fixed relationship between the bottom tray member 1 and the upper cover member 2. Also, the substrate 10 held by the holding members 1a is pressed by a pressing force provided by the pressing members 2a. The pressing force of the pressing members 2a may be provided by plastic deformation of a resin material, for example, or it may be provided by a spring force of a metal.

In the cassette of the present embodiment of the structure described above, when the cassette is conveyed while a substrate 10 is kept therein, the substrate displacement limiting members 1b and 1c as well as the pressing members 2a cooperate with each other to prevent vibration or displacement of the substrate 10 within the cassette. Further, for pressing the substrate 10, no movable mechanism is used in the space, which is defined by the bottom tray member 1 and the upper cover member 2 and in which the substrate 10 is placed, to produce the pressing force. Therefore, the possibility of dust production which adversely affects the substrate is largely reduced.

Next, description will be made of a cover opening/closing device into which the above-described cassette can be inserted and which is operable to separate the upper cover member 2 and the bottom tray member 1 of the cassette, for loading or off-loading of a substrate into or out of the cassette.

Figure 3:
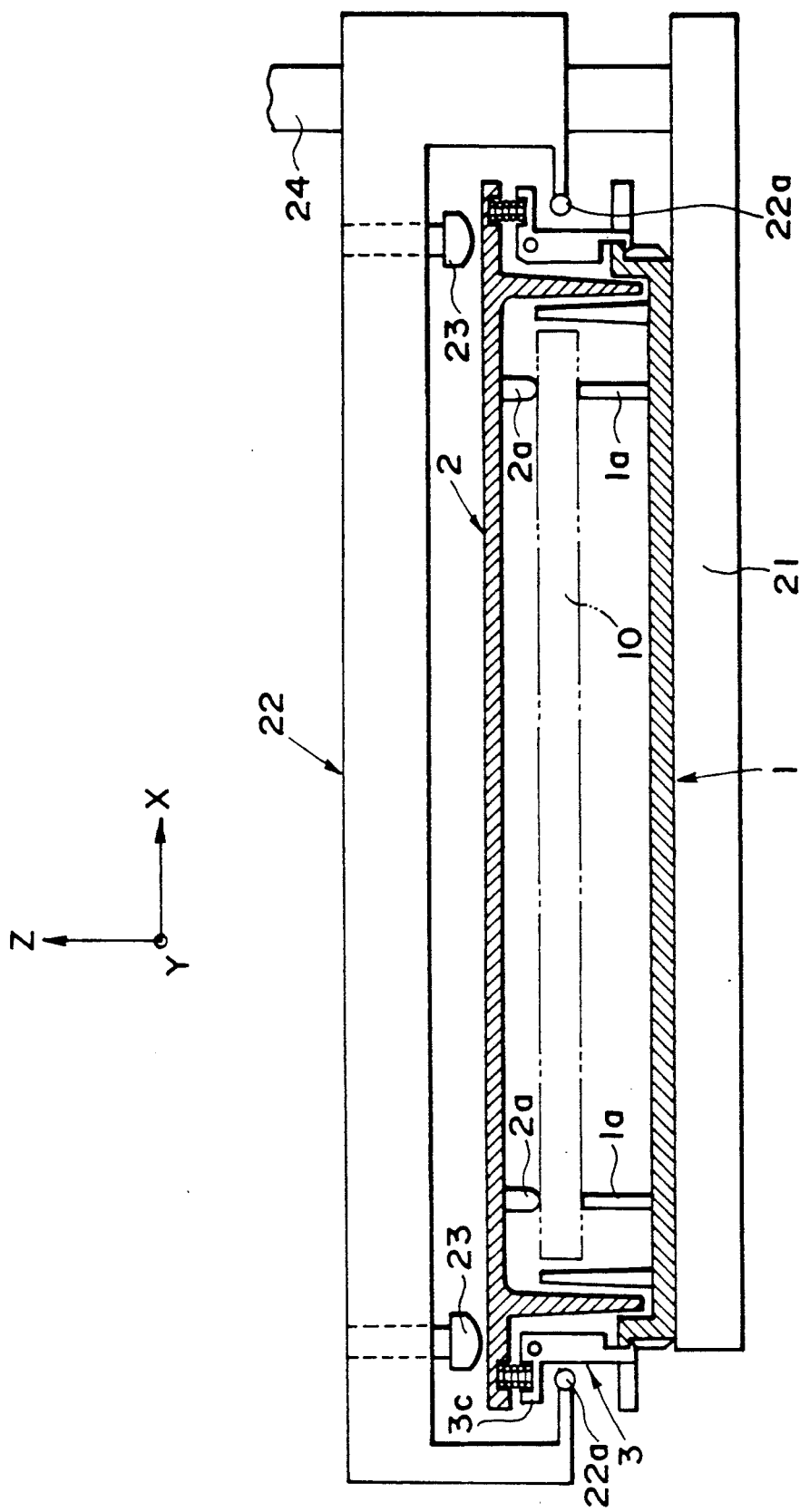
FIG. 3 is a sectional view for illustrating a cassette opening mechanism according to an embodiment of the present invention.

FIG. 3 shows a mechanism for separating the upper cover member 2 and the bottom tray member 1 of the cassette, as viewed from the cassette sectional plane. There is a bottom tray member holding member 21 for holding the bottom tray member 1 at its bottom surface. Also, there are provided an upper cover member holding member 22 and upper cover member pressing members 23, the former having releasing rollers 22a for releasing the engaging members 3. Each releasing roller is at the position spaced from the upper cover member 2 by a predetermined distance. The upper cover member holding member 22 is mounted through a supporting member 24 by which the holding member 22 is supported for vertical motion relative to the bottom tray member holding member 21.

FIGS. 4A–4C are enlarged view of the portion around the engaging member 3 of FIG. 3. As the cassette is placed stationary (FIG. 4A), due to the reaction force of the pressing members 2a there is defined a small spacing 25 between the upper cover member 2 and the bottom tray member 1.

When the cassette is to be off-loaded, first the upper cover member holding member 23 is moved downwardly along the Z direction. As the upper cover member 2 comes into engagement with the bottom tray member 1 (FIG. 4B), between the bottom tray member 1 and the engaging member 3 there is defined a small spacing 26 of substantially the same magnitude as the spacing 25. This spacing 26 functions to avoid sliding motion between the engaging portion 3b of the engaging member 3 and the engagement notch 1d of the bottom tray member 1.

Subsequently, while maintaining the pressing force of the upper cover member pressing members 23 substantially constant, the upper cover member holding member 22 is moved upwardly along the Z direction. Then, as shown in FIG. 4C, the engaging member 3 comes into contact with the roller 22a. As the holding member 22 further moves upwardly, the pressing force by the roller 22a becomes greater than the urging force of the spring 4, and the engaging member 3 rotationally moves about the hinge 3a in a direction away from the engagement notch 1d. As the holding member 22 further moves upwardly, the releasing member 3c abuts against a stopper 27, whereby the rotational motion is stopped. From this state, separation of the upper cover member 2 starts with continued upward motion of the holding member 22. At the position whereat the upper cover member 2 is completely separated from the bottom tray member 1, the upward motion of the holding member 22 is stopped, and easy loading and off-loading of the substrate 10 is assured.

To engage the separated upper cover member and bottom tray member of the cassette, the above-described operations may be made in a reversed order. Further, while not shown in the drawings, the upward motion of the holding member 22 may be replaced by or accompanied by downward motion of the bottom tray member holding member 21. Substantially the same operations will be made in such modified structure.

In the above-described cassette opening mechanism, it is possible to minimize the urging force of the spring 4 which presses the engaging member 3 against the engagement notch 1d, regardless of the magnitude of the pressing force produced by the pressing members 2a. Also, since during rotation of the engaging member 3 it is possible to avoid any sliding motion between it and the engagement notch 1d, the possibility of dust production and wearing of cassette can be minimized. Further, since the moving direction for rotating the engaging member 3 is in the same direction as the motion for separating the upper cover member 2 from the bottom tray member 1, the cassette opening mechanism can be made of a simple structure. Moreover, the upper cover member can be manually opened through the operation in the same direction, it can be handled easily with small dust production.

Figure 5:
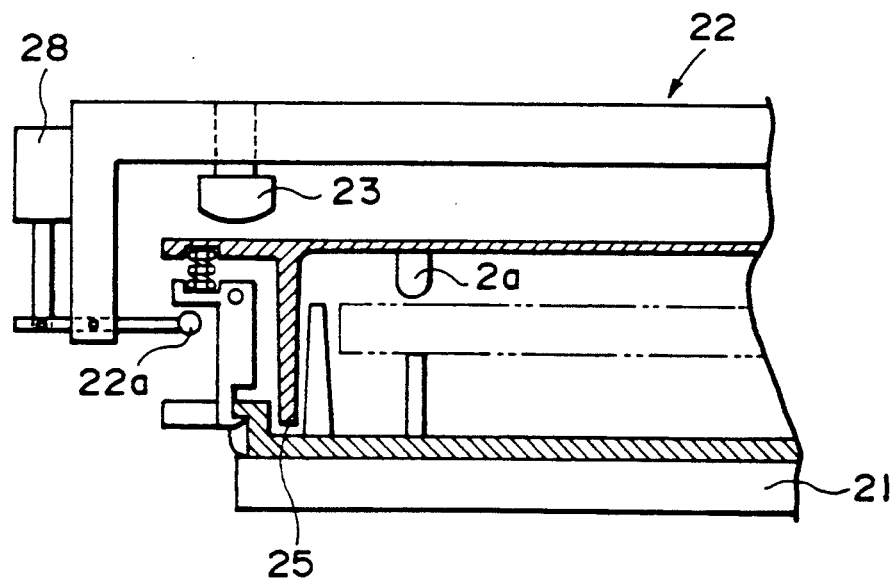
FIG. 5 is a fragmentary and schematic view of a modified form of the cassette opening mechanism of FIG. 3.

While in this embodiment the roller 22a is fixed to the holding member 22, it may be made movable through a driving means 28 (FIG. 5) such as a cylinder.

Figure 6:
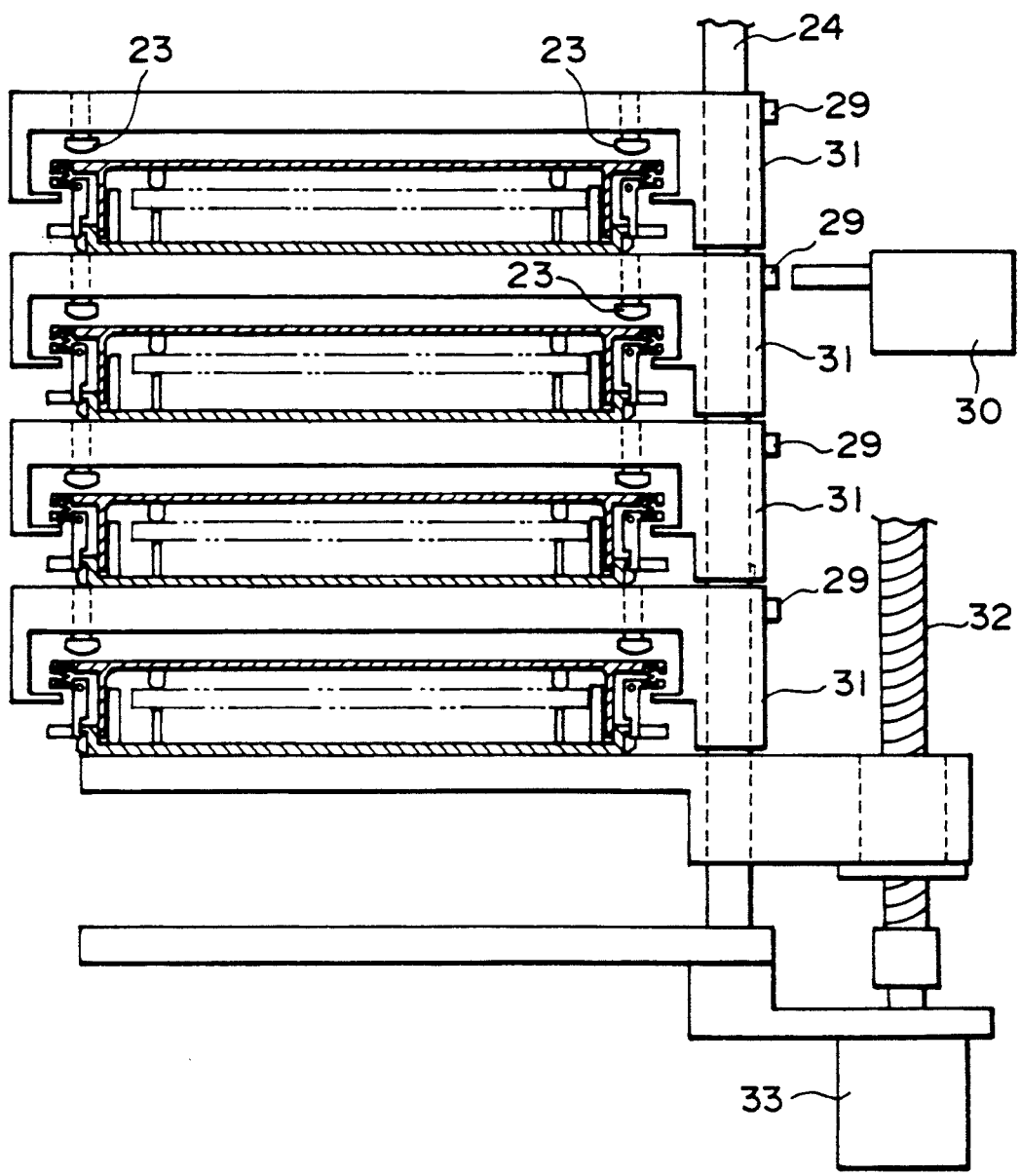
FIG. 6 is a side view of a cassette opening device according to an embodiment of the present invention, which uses a plurality of cassette opening mechanisms.

FIG. 6 shows an embodiment wherein a plurality of cassette opening mechanisms each being such as above are used. In this embodiment, the bottom tray member holding member 21 (FIG. 3) of a particular cassette and the upper cover member holding member 22 (FIG. 3) of an adjacent cassette, below the particular cassette, are structured into a single block 31. Thus, there are a plurality of blocks 31 which are accumulatingly supported by a supporting member 24 in the manner that each block can move vertically. Drive source 30 comprises a cylinder, for example, and it produces a pressing force of the upper cover member pressing members 23. Driven members 29 are provided at a predetermined position on the corresponding block 31, and serve as an input end for transmitting the drive of the drive source 30 to the pressing member 23. Ball screw and motor 33 provide a mechanism for moving each block 31 upwardly and downwardly. The drive source 30 and the driven member 29 are normally in a non-contact relationship but, when the block 31 moves upwardly or downwardly and the driven member 29 is brought into a predetermined positional relationship with the drive source 30, they come into contact with each other to permit transmission of the drive of the drive source 30 to the pressing member 23.

This avoids the necessity of providing plural drive sources (30) for all the blocks, and the structure of the mechanism can be made simple. It is to be noted that, while the relative position of the drive source 30 and the driven member 29 in this embodiment is adjusted by moving the block 31 upwardly or downwardly, the drive source 30 may be displaced upwardly or downwardly in place of it.

Figure 7A:
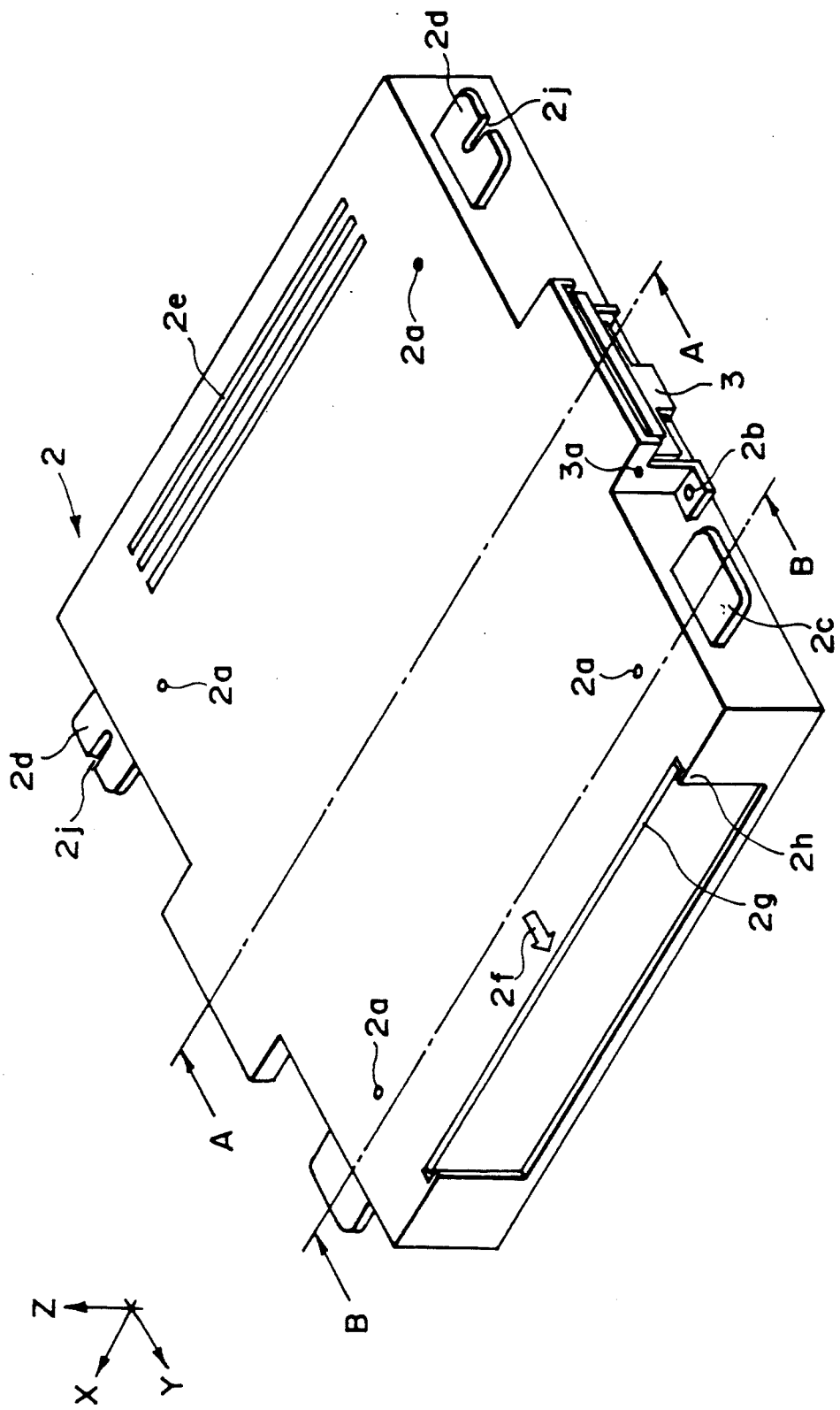
FIGS. 7A and 7B are schematic views of a separated upper cover member and bottom tray member, respectively, according to another embodiment of the present invention.
Figure 7B:
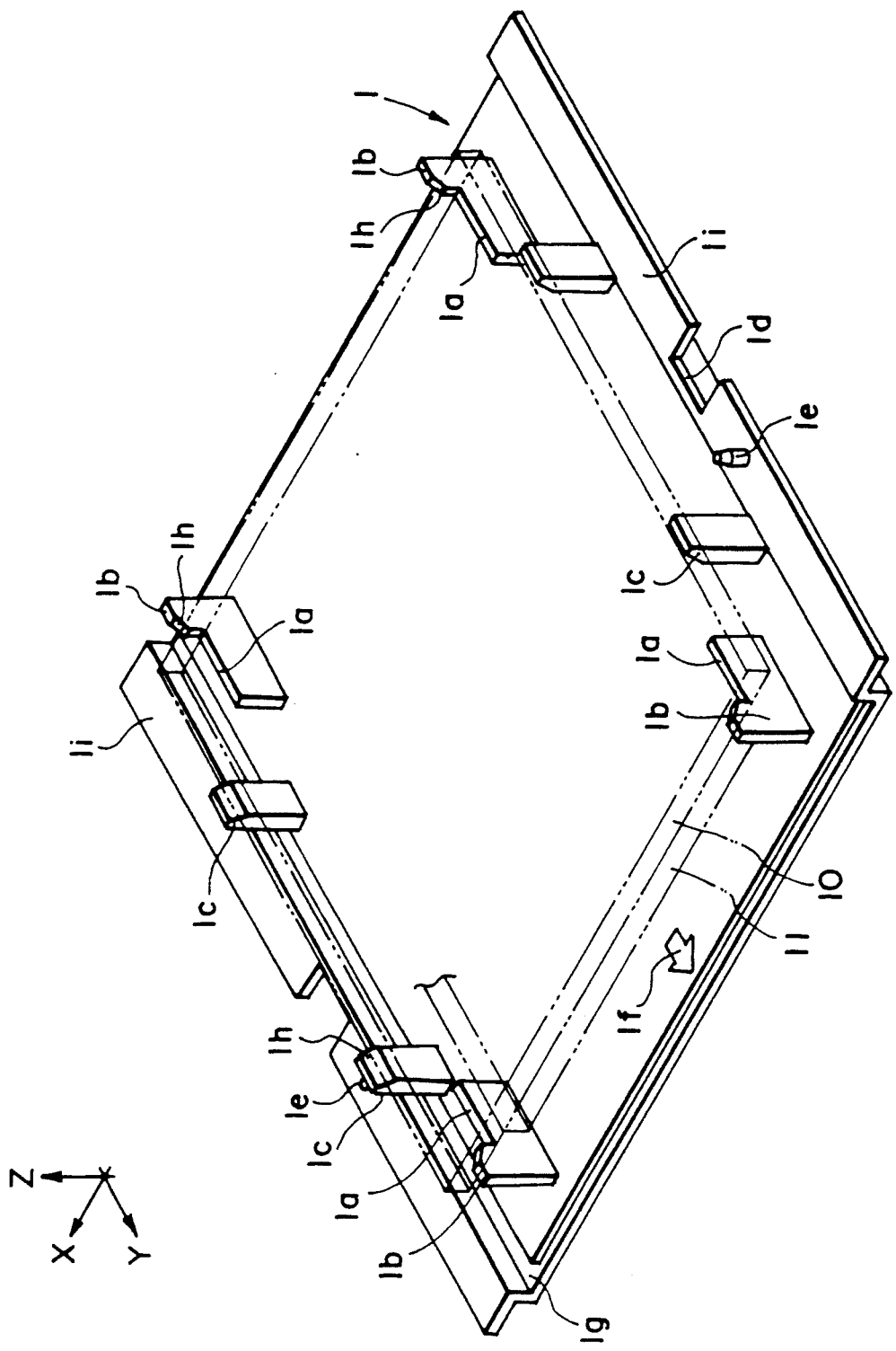

FIGS. 7A and 7B are perspective views of a container (cassette) for storing therein a substrate such as a reticle, according to another embodiment of the present invention. The container of the illustrated embodiment comprises an upper cover member 2 (FIG. 7A) and a bottom tray member 1 (FIG. 7B) each being formed by an integral structure made of a transparent resin material. The used resin material has a relatively high electric conductivity and thus is effective to prevent adhesion of dust to the cassette. The upper cover member and the bottom tray member are separated in the illustration of FIGS. 7A and 7B. As shown in FIG. 7B, the plate-like bottom tray member 1 is provided with four holding members 1a for holding a substrate at four corners on the bottom face thereof, as well as four limiting members 1b and additional four limiting members 1c all for limiting the motion of the substrate in lateral directions (X and Y directions). Each limiting member 1b is formed in an end portion of the upper surface of one of the corresponding holding members 1b, and it is engageable with the side of the substrate along the X direction. On the other hand, each limiting member 1c is engageable with the side of the substrate along the Y direction. Each of these limiting members 1b and 1c has formed on its top surface a taper 1h, for facilitating placement of the substrate 10. Each holding member 1a is formed to extend to a position inside, to some degree, of the outer periphery of the substrate 10 along the Y direction, so as to prevent incorrect setting of the substrate 10 which may have a pellicle 11.

In a forward end side portion of the upper surface of the bottom tray member 1 with respect to the Y direction and approximately at the center with respect to the X direction, there is formed a feature of arrow 1f which indicates the direction of mounting the cassette into an apparatus (hereinafter "main apparatus") in which the substrate stored in the cassette is to be used or processed. The feature of this arrow 1f is defined by a recess or protrusion (step) on the upper surface of the bottom tray member 1. Also, approximately in an outer peripheral portion of the bottom tray member 1, a small downward step 1g (along the Z direction) is formed. This downward step 1g is cooperable with the upper cover member 2 when engaged therewith to provide a labyrinth effect, preventing entrance of dust into the cassette. Further, at the opposite sides of the bottom tray member 1 with respect to the X direction, there are formed collars 1i through which the main apparatus can support the cassette. Each collar 1i extends in the Y direction, and it is at an intermediate position with respect to the Z direction between the upper surface of the bottom tray member 1 and the bottom surface of the substrate 10 held by the holding members 1a. Each collar 1i is provided with a notch 1d which provides an engagement recess to be engaged with the upper cover member engaging member 3 as well as a projecting pin 1e for limiting the position of the upper cover member 2 in the lateral directions (X and Y directions). The top of the pin 1e is tapered, for facilitating insertion of the same into an engagement hole 2b formed in the upper cover member 2.

Figure 8:
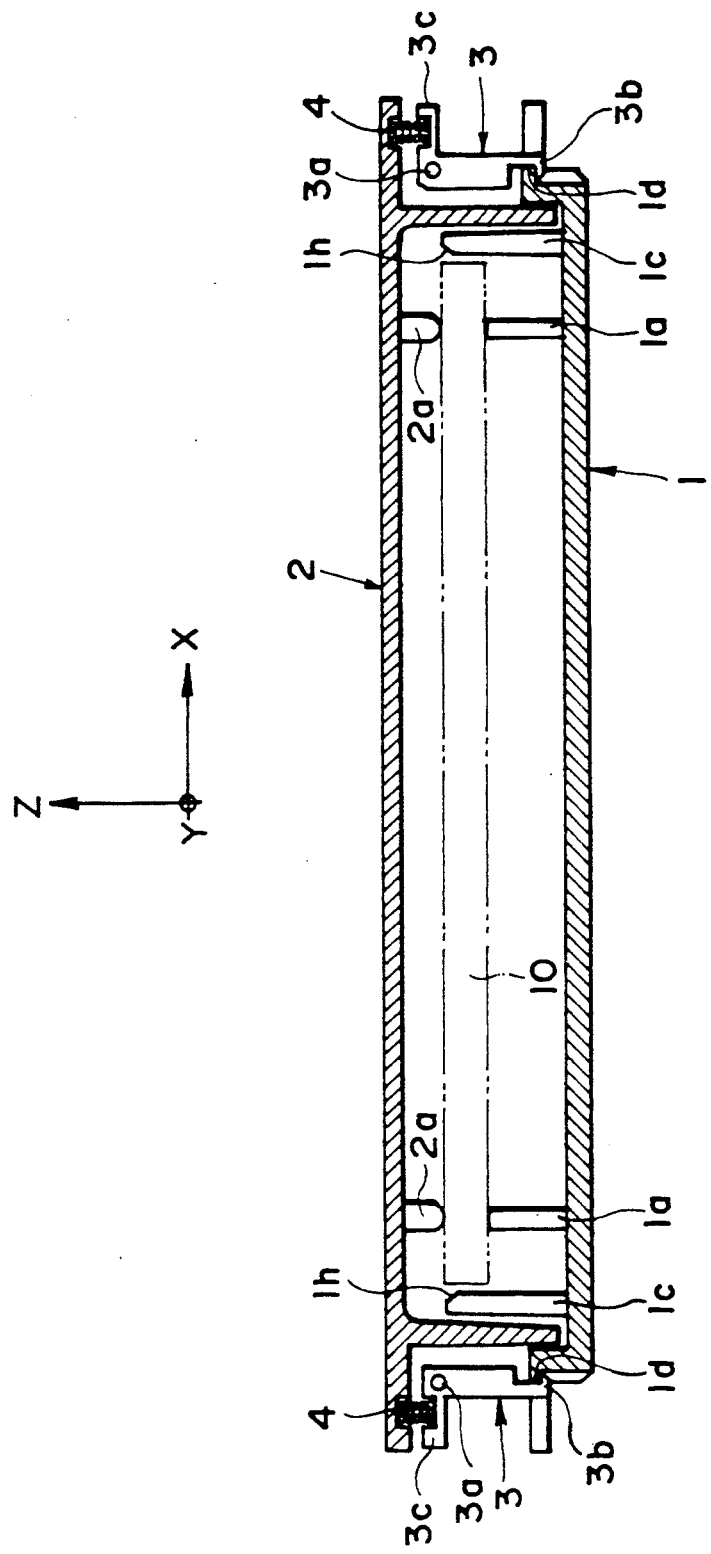
FIG. 8 is a sectional view of the cassette of FIG. 7, taken on line A—A, wherein a substrate is stored in the cassette.

On the other hand, the upper cover member 2 shown in FIG. 7A is provided with four pressing members 2a (only the mounting positions are illustrated) for pressing the substrate 10 in the space defined between the upper cover member 2 and the substrate 10 placed on the bottom tray member 1. Each pressing member 2a is opposed to one of the corresponding holding members 1a when the upper cover member 2 and the bottom tray member 1 are mated with each other, as shown in FIG. 8. At the opposite sides with respect to the X direction, the upper cover member 2 is further provided with holes 2b to be engaged by the projecting pins 1e, respectively, engaging members 3 each being rotatably supported by a hinge 3a, and projecting plates 2c and 2d through which the cassette or the upper cover member 2 can be supported within the main apparatus. The free ends of the projecting plates 2c and 2d are aligned with the outer periphery of the upper cover member 2. The projecting plate 2d has formed therein a positioning hole 2j to be engaged by a mating positioning pin (not shown) of an upper cover member opening device, so as to position the cassette within the upper cover member opening device, for example, of the main apparatus. The engaging members 3 are made of a similar resin material as of the upper cover member 2 or the bottom tray member 1 but, for apparent distinction of the same by an operator, it is colored with red, for example, different from the transparent upper cover member 2 and bottom tray member 1. Further, in order to avoid accidental slip of the cassette when it is to be grasped by the hand of the operator, on the top surface of the upper cover member 2 and at a rear end portion with respect to the cassette mounting direction into the main apparatus, there is provided a grip 2e which is defined by a plurality of (e.g. three) recessed or protruded stripes extending in the X direction.

In a forward end side portion of the upper surface of the upper cover member 2 with respect to the Y direction and approximately at the center with respect to the X direction, there is formed a feature of arrow 2f which indicates the direction of mounting the cassette into the main apparatus. The feature of arrow 2f is defined by a recess or protrusion (step) on the upper surface of the upper cover member 2. When the bottom tray member 1 and the upper cover member 2 are to be combined after a substrate is placed into the cassette, the feature of arrow 1f of the bottom tray member and the feature of arrow 2f of the upper cover member 2 may be used as indices for correct assembling.

Also, on the forward end side surface of the upper cover member 2 extending along the Y direction, there are provided a demountably inserted identification plate 2g and a plate receiving notch 2h. For cleaning of the cassette, for example, the identification plate 2g can be demounted from the plate receiving notch, and this effectively avoids damage of the plate 2g by the cleaning. Of course, the plate 2g itself can be replaced by a fresh one if it is contaminated or damaged, or the content identified is to be changed.

The identification plate 2g bears symbols such as a bar code, for example, for identification of the cassette or the substrate 10 therein. Such bar code may be read by a bar code reader of the main apparatus, when the cassette is inserted into the main apparatus.

FIG. 8 is a sectional view of the cassette and shows the bottom tray member 1 and the upper cover member 2 as they are engaged through the engaging members 3. In the illustrated position, the engaging member 3 is pressed against the engagement notch 1d by the urging force of the spring 4, and it serves as a limiting member for maintaining a constant relationship between the bottom tray member 1 and the upper cover member 2. The substrate 10 held by the holding members 1a is pressed by the pressing force produced by the pressing members 2a.

Figure 9:
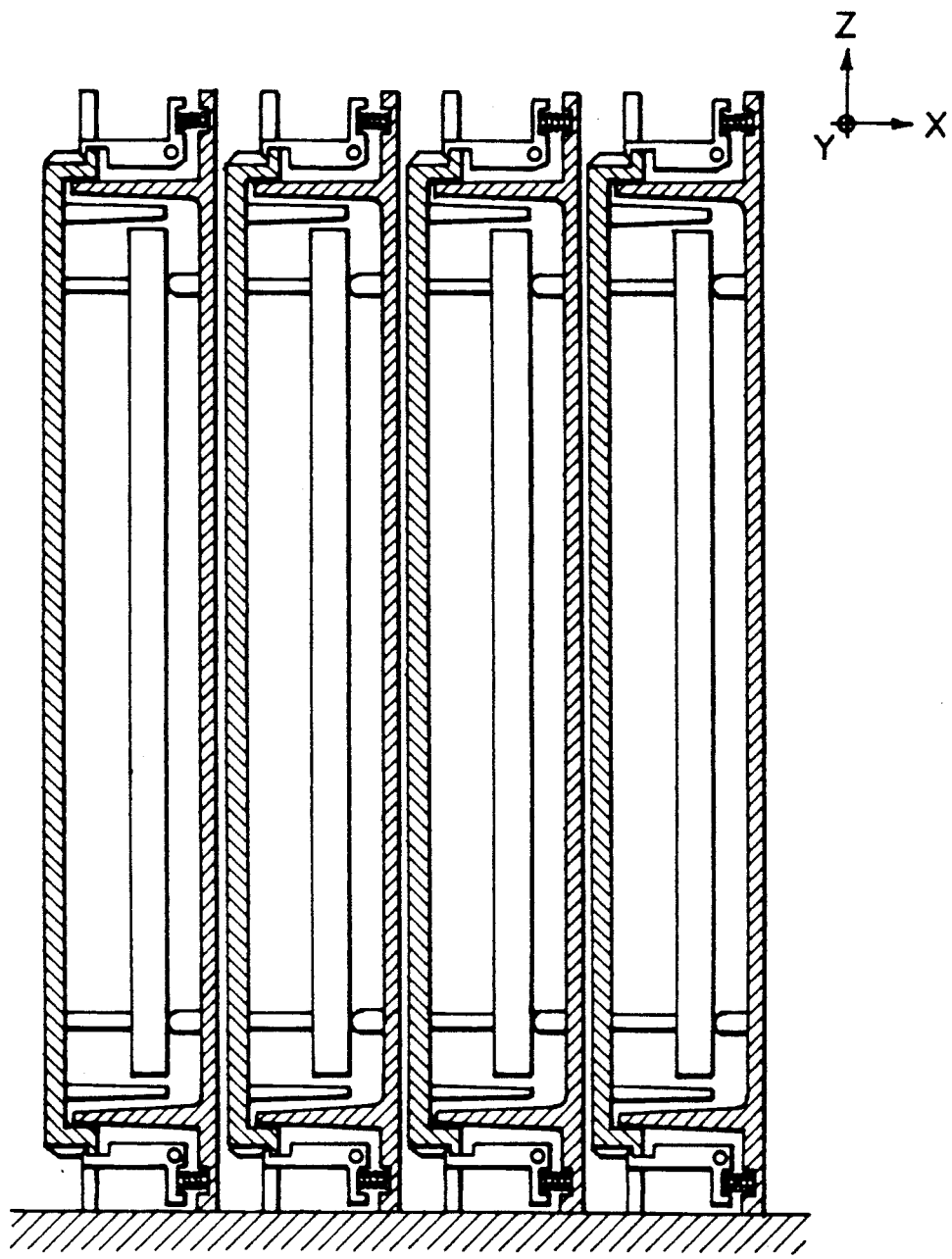
FIG. 9 is a sectional view for explaining the manner of cassette storing.

Like the cassette of FIG. 1, the cassette of the present embodiment has the advantage of reduced dust production in the cassette. Additionally, the outer periphery of the upper cover member 2 has substantially the same size as the bottom tray member 1 and, for this reason, as shown in FIG. 9, the cassette can be placed upstanding by itself while keeping the substrate therein. Also, no vibration of the substrate occurs therein. This assures enhanced flexibility and efficiency in respect to the storing when a plurality of containers are to be stored.

Next, the upper cover member opening/closing operation when the cassette is mounted into an opening device used in the main apparatus, will be explained.

Figure 10A:
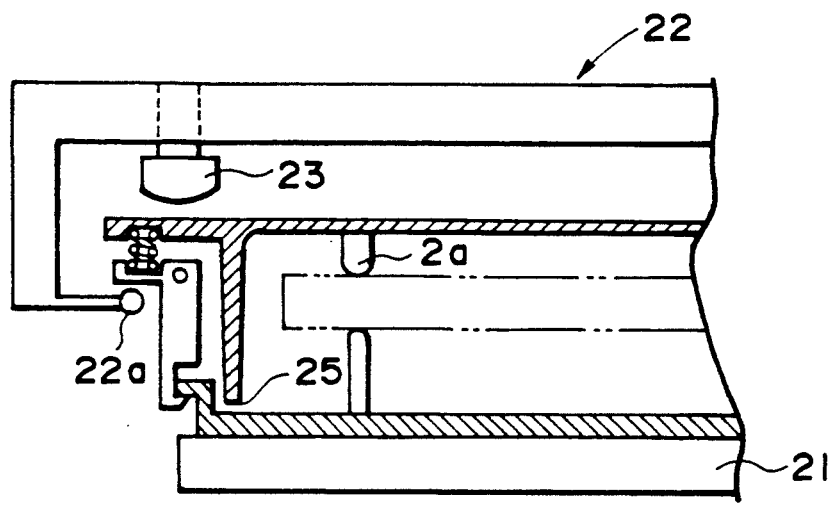
FIGS. 10A and 10B are fragmentary and sectional views, respectively, taken on line A—A, for explaining the operation of the cassette opening mechanism of FIG. 7.

FIGS. 10 and 11 are sectional views of a mechanism for separating the upper cover member 2 and the bottom tray member 1 of the cassette, as viewed from the cassette sectional plane. FIG. 10 is a section taken on line A—A in FIG. 7, and FIG. 11 is a section taken on line B-B in FIG. 7. The upper cover member opening device is provided with a bottom tray member holding member 21 for holding the bottom tray member 1 of the cassette at its bottom surface. Also, there are provided an upper cover member holding member 22 and upper cover member pressing members 23, the former having releasing rollers 22a for releasing the engaging members 3 and rollers 22b for holding the upper cover member. Each roller is at the position spaced from the upper cover member 2 by a predetermined distance. As regards the rollers 22b, there are provided four rollers corresponding to the projecting plates 2c and 2d. The upper cover member holding member 22 is mounted through a supporting member (not show) by which the holding member 22 is supported for vertical motion relative to the bottom tray member holding member 21.

As the cassette is placed stationary (FIGS. 10A and 11A), there is defined a small spacing between the rollers 22a and 22b and the engaging members 3 and the projecting plates 2c and 2d.

Figure 10B:
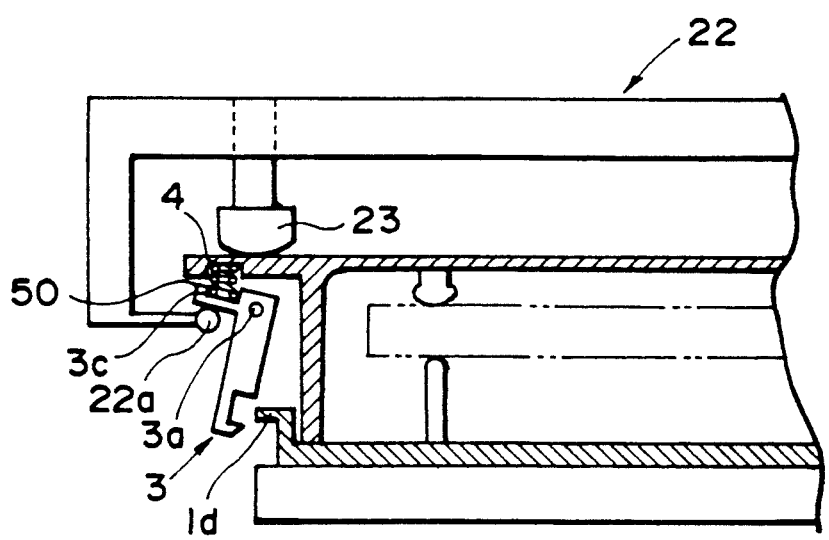

When the cassette is to be separated, first the upper cover member holding member 23 is moved downwardly. Subsequently, while maintaining the pressing force of the upper cover member pressing members 23 substantially constant, the upper cover member holding member 22 is moved upwardly. Then, the engaging member 3 comes into contact with the roller 22a. As the holding member 22 further moves upwardly, the pressing force by the roller 22a becomes greater than the urging force of the spring 4, and the engaging member 3 rotationally moves about the hinge 3a in a direction away from the engagement notch 1d. As the holding member 22 further moves upwardly, the projecting plates 2c and 2d abut against the rollers 22b (FIG. 11B). At this time, the engaging members 3 stops it rotation at the position whereat a spacing 50 remains between it and the upper cover member holding member 22 (FIG. 10B). From this state, separation of the upper cover member 2 starts with continued upward motion of the holding member 22. At the position whereat the upper cover member 2 is completely separated from the bottom tray member 1, the upward motion of the holding member 22 is stopped, and easy loading and off-loading of the substrate 10 is assured.

To engage the separated upper cover member and bottom tray member of the cassette, the above-described operations may be made in a reversed order.

In the above-described cassette opening operation, since the moving direction for rotating the engaging member 3 is in the same direction as the motion for separating the upper cover member 2 from the bottom tray member 1, the cassette opening mechanism can be made of a simple structure. Further, since the projecting plates 2c and 2d are supported by the rollers 22b before the upper cover member 2 and the bottom tray member 1 are separated, stable holding of the upper cover member 2 and thus improved stability are assured. Additionally, since the pressing force of the upper cover member pressing members 23 is transmitted through the projecting plates 2c and 2d and is received by the holding member 22, it is possible to prevent excessive force from being applied to the engaging members 3 and the hinges 3a. This ensures further simplification of the mechanism and reduction of dust production from a mechanical portion. This is very effective to improve the yield of products such as semiconductor devices and, also, to enhance the reliability of the main apparatus using such opening device.

While the invention has been described with reference to the structures disclosed herein, it is not confined to the details set forth and this application is intended to cover such modifications or changes as may come within the purposes of or the improvements of the scope of the following claims.

What is claimed is:

1. A container for containing therein a plate-like article such as a reticle, comprising:
   a bottom member having a holding portion for holding the article in a substantially laid-down state;
   an upper member to be mated with said bottom member to define a space above the upper surface of the article;
   a pressing member for resiliently pressing in the space the article against said holding portion;
   fixing means having an engaging member being supported by said upper member and being engageable with an end portion of said bottom member, said engaging member being effective to prevent upward opening motion of said upper member due to a reaction force of said pressing member; and
   releasing means partially projectable into said fixing means to press said fixing means in the same direction as the direction of the opening motion of said upper member to thereby release said engaging member.

2. A container according to claim 1, wherein said upper member has a projecting plate projecting therefrom and being effective to stably hold said upper member when the same is opened/closed in an opening device.

3. A container according to claim 2, wherein said projecting plate is held by an upper member holding means, operationally associated with a releasing means of said engaging member, provided in said opening device, after engagement of said engaging member and before opening of said upper member.

4. A container according to claim 2, wherein said outside periphery of said upper member, including the projecting plate, has substantially the same size as the outside peripheral size of said bottom member.

5. A cassette for storing therein a substrate to be used in a semiconductor device manufacturing process and for being mounted into an apparatus to be used in a semiconductor device manufacturing process, said cassette comprising:
   a first cassette element having a supporting portion for supporting the substrate;
   a second cassette element cooperable with said first cassette element to define a space in which the substrate is to be stored;
   an engaging member supported by said second cassette element, said engaging member being engageable with an engagement provided on said first cassette element to prohibit separation of said first and second cassette elements from each other; and
   disengaging means for disengaging said engaging member from said engagement in response to a force acting in a direction of separation of said first and second cassette elements from each other, wherein
   at least one of said first and second cassette elements is made of a substantially transparent material, and said engaging member has a color different from said second cassette element.

6. A cassette for storing therein a substrate to be used in a semiconductor device manufacturing process and for being mounted into an apparatus to be used in a semiconductor device manufacturing process, said cassette comprising:
   a first cassette element having a supporting portion for supporting the substrate;
   a second cassette element cooperable with said first cassette element to define a space in which the substrate is to be stored, said second cassette element having a portion which is substantially transparent; and
   an engaging member supported by said second cassette element, said engaging member being engageable with an engagement provided on said first cassette element to prohibit separation of said first and second cassette elements from each other, said engaging member having a color different from said second cassette element, wherein
   at least one of said first and second cassette elements is made of an electrically conductive resin material.

7. A cassette according to claim 6, wherein there are provided a plurality of engaging members disposed on opposite sides of said second cassette element.

8. A cassette according to claim 7, wherein each of said engaging members is rotatably supported by said second cassette element and is urged by a resilient member in a direction to be engaged with said engagement.

9. A cassette for storing therein a substrate to be used in a semiconductor device manufacturing process and for being mounted into an apparatus to be used in a semiconductor device manufacturing process, said cassette comprising:
   a first cassette element having a supporting portion for supporting the substrate;
   a second cassette element cooperable with said first cassette element to define a space in which the substrate is to be stored, said second cassette element having a portion which is substantially transparent; and an engaging member supported by said second cassette element, said engaging member being engageable with an engagement provided on said first cassette element to prohibit separation of said first and second cassette elements from each other, said engaging member having a color different from said second cassette element, wherein at least one of said first and second cassette elements is provided with an arrow which indicates a direction of mounting the cassette.

10. A cassette for storing therein a substrate to be used in a semiconductor device manufacturing process and for being mounted into an apparatus to be used in a semiconductor device manufacturing process, said cassette comprising:

a first cassette element having a supporting portion for supporting the substrate;

a second cassette element cooperable with said first cassette element to define a space in which the substrate is to be stored, said second cassette element having a substantially transparent portion and an arrow which indicates a direction of mounting the cassette; and an engaging member supported by said second cassette element, said engaging member being engageable with an engagement provided on said first cassette element to prohibit separation of said first and second cassette elements from each other, wherein the arrow is provided at a forward end side portion of said second cassette element.

11. A cassette according to claim 10, wherein said first cassette element has an arrow which serves as an index when said first cassette element is combined with said second cassette element.

12. A cassette according to claim 10, wherein at least one of said first and second cassette elements is provided with a grip at a rearward end side portion.

13. A cassette for storing therein a substrate to be used in a semiconductor device manufacturing process and for being mounted into an apparatus to be used in a semiconductor device manufacturing process, said cassette comprising:

a first cassette element having a supporting portion for supporting the substrate;

a second cassette element cooperable with said first cassette element to define a space in which the substrate is to be stored, said second cassette element having a substantially transparent portion and a plate guide for receiving a plate member; and an engaging member supported by said second cassette element, said engaging member being engageable with an engagement provided on said first cassette element to prohibit separation of said first and second cassette elements from each other, wherein at least one of said first and second cassette elements is made of an electrically conductive resin material.

14. A cassette according to claim 13, wherein said plate guide is provided on a forward end side face of said second cassette element.

* * * * *

UNITED STATES PATENT AND TRADEMARK OFFICE
CERTIFICATE OF CORRECTION

PATENT NO. : 5,314,068
DATED : May 24, 1994
INVENTOR(S) : Nakazato et al.

It is certified that error appears in the above-indentified patent and that said Letters Patent is hereby corrected as shown below:

COLUMN 4:

Line 50, "view" should read --views--.

COLUMN 8:

Line 43, "show)" should read --shown)--.
Line 64, "members" should read --member--.

Signed and Sealed this

Thirteenth Day of December, 1994

Attest:

BRUCE LEHMAN

*Attesting Officer*   *Commissioner of Patents and Trademarks*